United States Patent [19]

Drako et al.

[11] Patent Number: 5,371,877
[45] Date of Patent: Dec. 6, 1994

[54] APPARATUS FOR ALTERNATIVELY ACCESSING SINGLE PORT RANDOM ACCESS MEMORIES TO IMPLEMENT DUAL PORT FIRST-IN FIRST-OUT MEMORY

[75] Inventors: Dean M. Drako, Los Altos; Hsin-Tung A. Yu, Palo Alto, both of Calif.

[73] Assignee: Apple Computer, Inc., Cupertino, Calif.

[21] Appl. No.: 816,159

[22] Filed: Dec. 31, 1991

[51] Int. Cl.$^5$ .............................................. G06F 12/02
[52] U.S. Cl. ............................. 395/425; 364/DIG. 1; 364/244.8
[58] Field of Search ... 364/200 MS File, 900 MS File; 395/425

[56] References Cited

U.S. PATENT DOCUMENTS

| | | | |
|---|---|---|---|
| 4,156,798 | 5/1979 | Doelz | 370/85.12 |
| 4,448,543 | 5/1984 | Vail | 368/202 |
| 4,493,033 | 1/1985 | Ziegler et al. | 395/425 |
| 4,541,076 | 9/1985 | Bowers et al. | 365/230.05 |
| 4,580,245 | 4/1986 | Ziegler et al. | 365/154 |
| 4,652,993 | 3/1987 | Scheuneman et al. | 395/425 |
| 4,694,426 | 9/1987 | Mason | 365/78 |
| 4,748,618 | 5/1988 | Brown et al. | 370/94.1 |
| 4,797,815 | 1/1989 | Moore | 395/325 |
| 4,853,845 | 8/1989 | Zimmer et al. | 395/550 |
| 4,860,263 | 8/1989 | Mattausch | 365/230.05 |
| 4,891,788 | 1/1990 | Kreifels | 365/49 |
| 4,914,575 | 4/1990 | Kihara et al. | 395/425 |
| 4,933,846 | 6/1990 | Humphrey et al. | 395/325 |
| 4,947,373 | 8/1990 | Yamaguchi et al. | 365/189.04 |
| 4,959,803 | 9/1990 | Kiyohara et al. | 395/157 |
| 4,959,854 | 9/1990 | Cave et al. | 379/157 |
| 4,995,005 | 2/1991 | Lodhi | 365/221 |
| 5,027,330 | 6/1991 | Miller | 365/239 |
| 5,157,775 | 10/1992 | Sanger | 395/425 |
| 5,261,064 | 11/1993 | Wyland | 395/400 |

OTHER PUBLICATIONS

Mano, Computer System Architecture, 2nd Edition, 1982, pp. 217 to 284.

Primary Examiner—Joseph L. Dixon
Assistant Examiner—Matthew M. Kim
Attorney, Agent, or Firm—Blakely, Sokoloff, Taylor & Zafman

[57] ABSTRACT

A circuit for providing the function of a dual port FIFO circuit including a first bank of single port random access memory, a second bank of single port random access memory, apparatus for sequentially writing every other piece of sequential data to an alternate one of the first and second [memory] banks of single port memory, and apparatus for simultaneously reading the earliest written piece of sequential data from the one [each] of the first and second [memory] banks of single port memory not being written during the period data is being written to the other of the [memory] banks of single port memory. By using two banks of single port memory, the cost of dual port memory typically used for a FIFO circuit is substantially reduced.

26 Claims, 4 Drawing Sheets

□ Indicates external terminals that are equivalent to a traditional FIFO

□ Indicates external terminals that are equivalent to a traditional FIFO

Examples:

case 1: wrong bank and individual single holds

| Clock Count | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Write Bank Sel | 0 | 1 | 0 | 1 | 0 | 1 | 0 | 1 | 0 | 1 | 0 | 1 | 0 | |
| ~Write Bank Sel | 1 | 0 | 1 | 0 | 1 | 0 | 1 | 0 | 1 | 0 | 1 | 0 | 1 | |
| Pop | | | | | | | | 0 | | 0 | | | | |
| Current Data | 1 | 0 | 1 | 2 | 3 | 4 | 5 | 6 | 7 | 8 | 7 | 8 | 9 | |
| Delayed Data | x | 1 | 0 | 1 | 2 | 3 | 4 | 5 | 6 | 7 | 8 | 7 | 8 | |
| MuxSel | 0 | 0 | 0 | 0 | 0 | 0 | 0 | 0 | 1 | 1 | 0 | 0 | 0 | |
| Read Data | 1 | 0 | 1 | 2 | 3 | 4 | 5 | 6 | 6 | 7 | 7 | 8 | 9 | |
| Read Wait | 1 | | | | | | | | | | | | | |
| Desired Data | | 0 | 1 | 2 | 3 | 4 | 5 | 6 | 6 | 7 | 7 | 8 | 9 | |

~ = inverted
x = don't care case 2: wrong bank and one single holds

| Clock Count | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Write Bank Sel | 0 | 1 | 0 | 1 | 0 | 1 | 0 | 1 | 0 | 1 | 0 | 1 | 0 | |
| ~Write Bank Sel | 1 | 0 | 1 | 0 | 1 | 0 | 1 | 0 | 1 | 0 | 1 | 0 | 1 | |
| Pop | | | | | | | | 0 | | | | | | |
| Current Data | 1 | 0 | 1 | 2 | 3 | 4 | 5 | 6 | 7 | 8 | 9 | | | |
| Delayed Data | x | 1 | 0 | 1 | 2 | 3 | 4 | 5 | 6 | 7 | 8 | 9 | | |
| MuxSel | 0 | 0 | 0 | 0 | 0 | 0 | 0 | 0 | 1 | 1 | 1 | 1 | | |
| Read Data | 1 | 0 | 1 | 2 | 3 | 4 | 5 | 6 | 6 | 7 | 8 | 9 | | |
| Read Wait | 1 | | | | | | | | | | | | | |
| Desired Data | | 0 | 1 | 2 | 3 | 4 | 5 | 6 | 6 | 7 | 8 | 9 | | | case 3: right bank and individual single holds

| Clock Count | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Write Bank Sel | 1 | 0 | 1 | 0 | 1 | 0 | 1 | 0 | 1 | 0 | 1 | 0 | 1 | |
| ~Write Bank Sel | 0 | 1 | 0 | 1 | 0 | 1 | 0 | 1 | 0 | 1 | 0 | 1 | 0 | |
| Pop | | | | | | | | 0 | | 0 | | | | |
| Current Data | 0 | 1 | 2 | 3 | 4 | 5 | 6 | 7 | 6 | 7 | 8 | 9 | | |
| Delayed Data | x | 0 | 1 | 2 | 3 | 4 | 5 | 6 | 7 | 6 | 7 | 8 | 9 | |
| MuxSel | 0 | 0 | 0 | 0 | 0 | 0 | 0 | 1 | 1 | 0 | 0 | 0 | | |
| Read Wait | | | | | | | | | | | | | | |
| Read Data | 0 | 1 | 2 | 3 | 4 | 5 | 6 | 6 | 7 | 7 | 8 | 9 | | |
| Desired Data | 0 | 1 | 2 | 3 | 4 | 5 | 6 | 6 | 7 | 7 | 8 | 9 | | | case 4: wrong bank and double holds

| Clock Count | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Write Bank Sel | 0 | 1 | 0 | 1 | 0 | 1 | 0 | 1 | 0 | 1 | 0 | 1 | 0 | |
| ~Write Bank Sel | 1 | 0 | 1 | 0 | 1 | 0 | 1 | 0 | 1 | 0 | 1 | 0 | 1 | |
| Pop | | | | | | | | | 0 | 0 | | | | |
| Current Data | 1 | 0 | 1 | 2 | 3 | 4 | 5 | 6 | 7 | 8 | 7 | 8 | 9 | |
| Delayed Data | x | 1 | 0 | 1 | 2 | 3 | 4 | 5 | 6 | 7 | 8 | 7 | 8 | |
| MuxSel | 0 | 0 | 0 | 0 | 0 | 0 | 0 | 0 | 0 | 1 | 0 | 0 | 0 | |
| Read Data | 1 | 0 | 1 | 2 | 3 | 4 | 5 | 6 | 7 | 7 | 7 | 8 | 9 | |
| Read Wait | 1 | | | | | | | | | | | | | |
| Desired Data | | 0 | 1 | 2 | 3 | 4 | 5 | 6 | 7 | 7 | 7 | 8 | 9 | |

Figure 3a case 5: right bank and double holds

| Clock Count | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Write Bank Sel | 1 | 0 | 1 | 0 | 1 | 0 | 1 | 0 | 1 | 0 | 1 | 0 | 1 | |
| ~Write Bank Sel | 0 | 1 | 0 | 1 | 0 | 1 | 0 | 1 | 0 | 1 | 0 | 1 | 0 | |
| Pop | | | | | | | 0 | 0 | | | | | | |
| Current Data | 0 | 1 | 2 | 3 | 4 | 5 | 6 | 7 | 6 | 7 | 8 | 9 | | |
| Delayed Data | x | 0 | 1 | 2 | 3 | 4 | 5 | 6 | 7 | 6 | 7 | 8 | 9 | |
| MuxSel | 0 | 0 | 0 | 0 | 0 | 0 | 0 | 1 | 0 | 0 | 0 | 0 | | |
| Read Data | 0 | 1 | 2 | 3 | 4 | 5 | 6 | 6 | 6 | 7 | 8 | 9 | | |
| Read Wait | | | | | | | | | | | | | | |
| Desired Data | 0 | 1 | 2 | 3 | 4 | 5 | 6 | 6 | 6 | 7 | 8 | 9 | | | case 6: right bank and single holds

| Clock Count | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Write Bank Sel | 1 | 0 | 1 | 0 | 1 | 0 | 1 | 0 | 1 | 0 | 1 | 0 | 1 | |
| ~Write Bank Sel | 0 | 1 | 0 | 1 | 0 | 1 | 0 | 1 | 0 | 1 | 0 | 1 | 0 | |
| Pop | | | | | | | 0 | | | | | | | |
| Current Data | 0 | 1 | 2 | 3 | 4 | 5 | 6 | 7 | 8 | 9 | | | | |
| Delayed Data | x | 0 | 1 | 2 | 3 | 4 | 5 | 6 | 7 | 8 | 9 | | | |
| MuxSel | 0 | 0 | 0 | 0 | 0 | 0 | 1 | 1 | 1 | 1 | 1 | | | |
| Read Data | 0 | 1 | 2 | 3 | 4 | 5 | 5 | 6 | 7 | 8 | 9 | | | |
| Read Wait | | | | | | | | | | | | | | |
| Desired Data | 0 | 1 | 2 | 3 | 4 | 5 | 5 | 6 | 7 | 8 | 9 | | | |

APPARATUS FOR ALTERNATIVELY ACCESSING SINGLE PORT RANDOM ACCESS MEMORIES TO IMPLEMENT DUAL PORT FIRST-IN FIRST-OUT MEMORY

FIELD OF THE INVENTION

This invention relates to computer circuits and, more particularly, to apparatus for utilizing conventional single port random access memories to implement a dual port first-in first-out memory.

HISTORY OF THE PRIOR ART

There is often a need in computers for arrangements which are capable of simultaneously storing information and providing information previously stored. One such circuit is dual port first-in first-out (FIFO) circuitry. In accordance with its name, information is written to a FIFO circuit in sequence and read out of the circuit in the same sequence after some delay. Such circuitry has one port through which data is written to the arrangement and a second port through which data is read from the arrangement. The circuitry is typically implemented using a memory which has individual sets of terminals for providing read and write addresses and separate read and write addressing circuitry. Because individual sets of read and write address ports are available with separate read and write addressing circuitry, information may be written to the memory while other information is being read from the memory.

Typical FIFO circuitry is useful but expensive relative to the cost of standard single port memory circuitry. This increase in cost is due to the need for circuitry to provide both read and write functions simultaneously. Moreover, it is possible for this additional circuitry to so complicate the design of the arrangement that the speed at which the memory may be accessed is less than that of standard single port memory circuitry. The additional logic circuitry necessary to provide dual port operation in the typical dual port memory increases the size of the circuitry and, in this larger size, the circuitry may operate more slowly than do single port random access memories.

SUMMARY OF THE INVENTION

It is, therefore, an object of the present invention to utilize conventional single port random access memory to perform the function of dual port FIFO memory.

It is another object of the present invention to increase the speed of operation and reduce the physical size of a large FIFO memory through the use of conventional single port random access memory instead of dual port memory.

These and other objects of the present invention are realized in a dual port FIFO circuit comprising a first bank of single port random access memory, a second bank of single port random access memory, means for sequentially writing every other piece of sequential data to an alternate one of the memory banks, and means for reading each of the memory banks during the period data is being written to the other of the memory banks.

These and other objects and features of the invention will be better understood by reference to the detailed description which follows taken together with the drawings in which like elements are referred to by like designations throughout the several views.

BRIEF DESCRIPTION OF THE DRAWINGS

FIGS. 3a and 3b are series of examples of the operation of the circuitry illustrated in FIG. 2.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. In all cases the distinction between the method operations in operating a computer and the method of computation itself should be borne in mind. The present invention relates to an apparatus for operating a computer in processing electrical or other (e.g. mechanical, chemical) physical signals to generate other desired physical signals.

DETAILED DESCRIPTION OF THE INVENTION

Figure 1A:
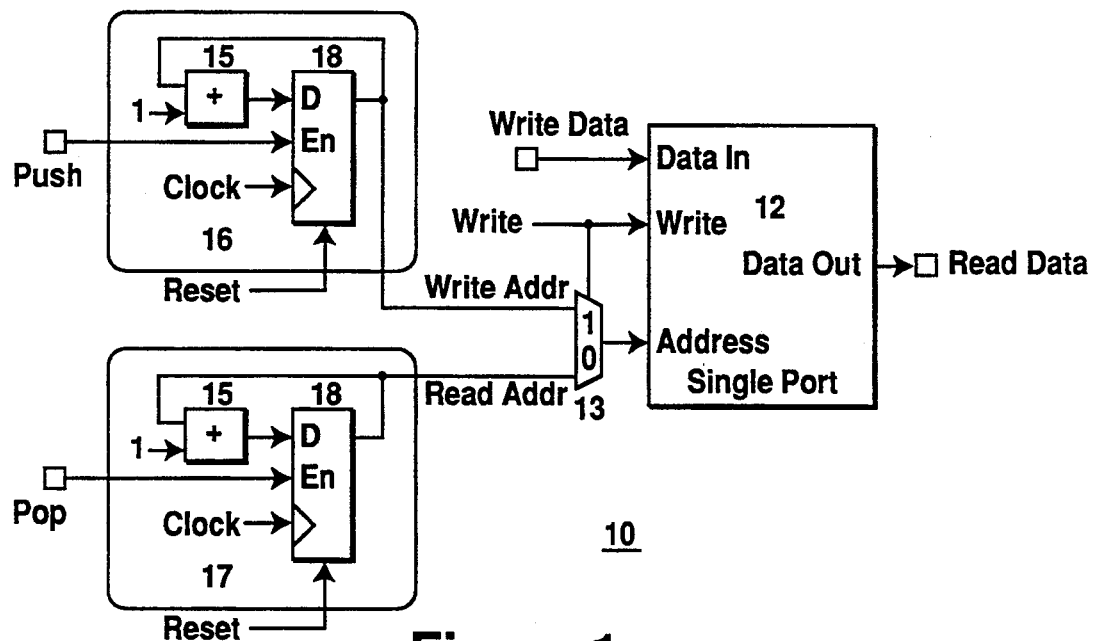
FIGS. 1a and 1b show block diagrams comparing the design of single port memory and dual port memory as used in the prior art.
Figure 1B:
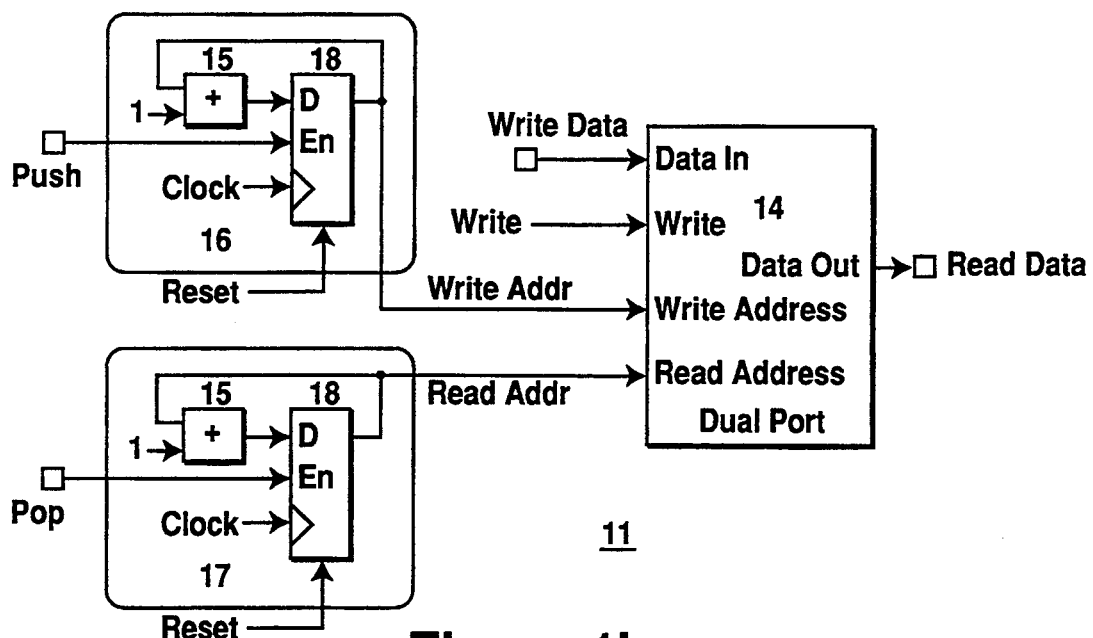

Referring now to FIGS. 1a and 1b, there are shown block diagrams of an arrangement 10 including a single port FIFO memory circuit 12 and an arrangement 11 including a dual port FIFO memory circuit 14. Information is written to each such FIFO circuit in sequence and read out of the circuit in the same sequence after some delay. The single port FIFO circuit 12 receives input data (WRITE DATA) at a set of input terminals labeled DataIn. The FIFO circuit 12 also has a set of output terminals labelled DataOut from which data (READ DATA) may be read. The FIFO circuit 12 has a single address input port to which addresses are transferred for both read and write operations. A multiplexor 13 transfers either read or write addresses to the single address port in response to selection signals. A write selection signal (a one) selects write addresses while the absence of a write selection signal (a zero) selects read addresses. The multiplexor 13 receives input addresses from a first circuit 16 which provides write addresses to the FIFO and from another circuit 17 which provides read addresses to the FIFO.

Each of the circuits 16 and 17 includes an adder 15 and a register 18. The current address (which is typically zeroed at a beginning address by a reset signal) is held in the register 18 and provided at its output terminals. The register 18 receives an input signal equal to the current address plus one from the adder 15. The register 18 provides the current address at its output terminals until it receives an enabling increment signal (here shown as a PUSH or a POP signal) along with the system clock and transfers the address from the adder 15 to its output terminals. Conventionally, the signal applied to increment the address to which data is directed on the write data lines is referred to as a PUSH signal while the signal applied to increment the address from which information is read is referred to as a POP signal. The address at the output of the register 18 is transferred to the multiplexor 13. The multiplexor 13 responds to the selection signal (read or write) to transfer the appropriate address for the selected read or write operation.

As pointed out, a single address port is provided within the FIFO circuit 12 to receive both the addresses at which data is to be stored in the memory array and the addresses at which data is to be read from the memory array. Because the circuit 12 provides only a single address port, a single memory location can be either read or written at any time, but not both. For this reason, the memory is called single port memory.

The dual port FIFO circuit 14 also includes a set of terminals for receiving write data and a set of terminals for furnishing read data as output. However, in contrast to the single port FIFO circuit 12, the dual port FIFO circuit 14 has two sets of address terminals, a first set of input address terminals at which a write address is presented and a second separate set of input address terminals at which a read address is presented. As may be seen, each of these read or write addresses is presented from one of two individual address incrementing circuits 16 or 17 each of which includes an adder 15 and a register 18 comparable to the circuits 16 and 17 of the FIFO circuit 12. The circuits 16 and 17 each function in the same manner as the previously discussed circuits 16 and 17 to furnish read and write addresses to the sets of read and write address terminals of the FIFO circuit 14. Since individual read and write addresses do not have to be multiplexed to a single address terminal of the FIFO circuit 14, read and write operations may be performed in the FIFO circuit 14 simultaneously. The two separate read and write data ports and the two separate sets of read address and write address terminals within the circuit 14 allow data to be both read and written to individual memory locations at the same time.

However, dual port FIFO memories are, as pointed out above, quite expensive and may be slower in operation than single port FIFO memories. It is therefore desirable to implement the operations of a dual port FIFO memory using less expensive single address port memory chips.

Figure 2:
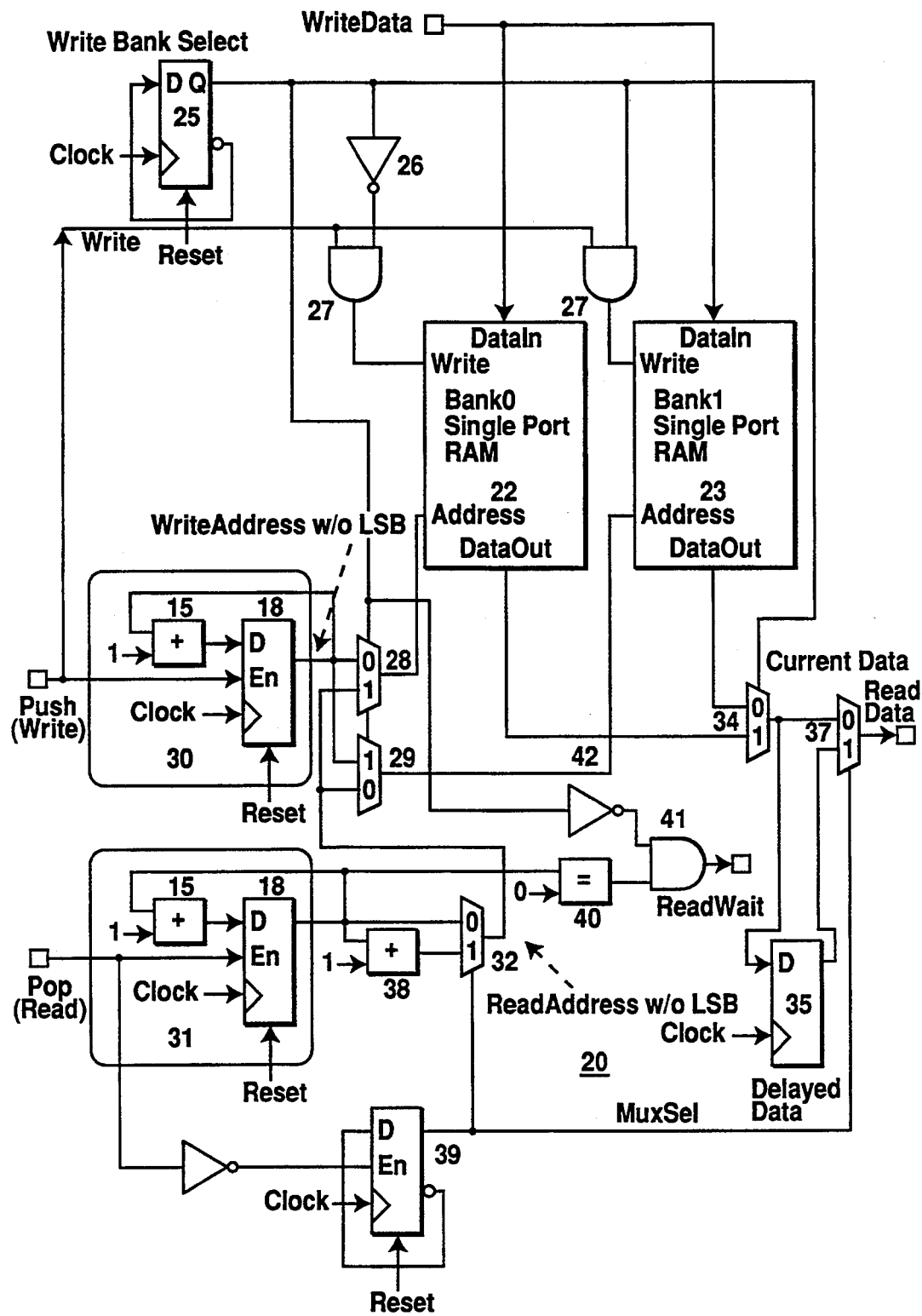
FIG. 2 is a dual port FIFO memory which both receives data and provides data simultaneously utilizing conventional single port random access memory.

The circuit 20 of FIG. 2 has been designed to allow single port random access memory to be used to provide a dual port FIFO memory which may both receive data and furnish data simultaneously. The circuit 20 includes a first bank of single port random access memory 22 and a second bank of single port random access memory 23. Each of the banks of memory 22 and 23 has a set of input terminals (DataIn) and a set of output terminals (DataOut). Each of the banks of memory 22 and 23 also has a single set of address terminals at which an address is presented for data to be either read or written.

A master write bank selector circuit 25 is clock driven to provide signals for selecting whether a read or a write operation is to occur at a particular one of the two banks of memory 22 and 23. The selector circuit 25 also provides selection signals to circuitry used for providing addresses to the banks of memory and to circuitry for reading information from the banks of memory.

In many applications data is written to a FIFO memory circuit in bursts in which pieces of data follow one another in sequential order during sequential clock periods. In such a case, a first piece of data will appear at a first clock period on the WriteData input lines and is made available to both of the banks of memory 22 and 23 at their DataIn terminals. As may be seen, the circuit 25 provides a control signal (a one or a zero) at its output terminal which indicates either a read or a write operation. The circuit 25 is essentially a flip-flop circuit which feeds back an inverted output signal appearing at its inverted terminal on each clock cycle as input for the next clock cycle. In this manner, the circuit 25 alternates the value of the output signal provided at each sequential clock period. A zero value output signal from the circuit 25 is inverted and transferred by an inverter circuit 26 to an AND gate 27. If the signal appearing on a write input terminal of the AND gate 27 (a PUSH incrementing signal) indicates (by being a one value) that a write operation is intended at one of the two banks of memory, the AND gate 27 transfers the inverted signal from the circuit 25 to the bank 22 to indicate a write operation. This allows data appearing on the WriteData input lines to be written to a memory address in bank 22. The same zero value control signal from circuit 25 is transferred to another AND gate 27 and therefrom to the bank 23 as a zero value to enable a read operation of the bank 23 during that clock period. Thus a single signal from the circuit 25 causes a write operation to be selected for the memory bank 22 and a read operation to be selected for the bank 23 during the same clock period.

When, on the other hand, the output signal produced by the circuit 25 has a one value, the AND gate 27 to the bank 22 transfers a zero value to that bank to indicate that a read operation is to be performed. Simultaneously, the one value signal from the circuit 25 is transferred by the AND gate 27 to the bank 23 to indicate a write operation (assuming the one value Write signal is present) and the data on the Write Data lines to the bank 23 is accepted.

Since the signal from the circuit 25 provided to each of the banks 22 and 23 alternates on each new clock, one bank of memory is selected for a write operation and the other bank of memory is selected for a read operation during each clock period in which a write (PUSH) signal is present; and each bank of memory is switched to the alternate operation for the next clock cycle.

Consequently, when data to be written to the FIFO appears in sequential order on the lines WriteData during sequential clock periods, a first piece of data is written to one memory bank, the next piece of data is written to the other memory bank, the next piece of data is written to the first memory bank, and so on. The addresses to which the individual pieces of data are written are provided on a set of WriteAddress lines from write address generating circuitry 30. Write address generating circuitry 30 may be identical to the address generating circuit 16 including the adder 15 and the register 18 discussed above with respect to FIG. 1. The addresses are incremented in a sequence beginning at an initial zero address (by a reset signal) in response to an address incrementing PUSH signal.

All but the least significant bit of the address generated at the output of the register 18 of the circuit 30 is furnished to a pair of multiplexors 28 and 29. The signal provided by the selector circuit 25 which is used to select the memory bank 22 or 23 to be written or read is also used to select the one of the multiplexors 28 and 29 which is chosen to transfer a write address (and thus the memory bank to which the data is written). If the signal from the circuit 25 has a zero value, the multiplexor 28 is chosen and the write address is transferred to the address terminals of the bank 22. If the signal from the circuit 25 has a one value, the multiplexor 29 is chosen and the write address is transferred to the address terminals of the bank 23. In this manner, the FIFO 20 may receive write data during each clock period but stores each piece of that data in alternate single port banks of memory 22 and 23. Thus, the signal from circuit 25 which causes the selection of the memory bank to be written also selects the write address and, in effect, provides the least significant bit of the memory address. In effect, each of the pieces of data stored in memory bank 22 has a zero as the lowest order bit of its address indicating an even numbered address; and each of the pieces of data stored in memory bank 23 has a one as the lowest order bit of its address indicating an odd numbered address. For that reason memory bank 22 is sometimes referred to as "bank 0" and memory bank 23 is sometimes referred to as "bank 1."

During each clock period in which data is being written to one of the memory banks, the other bank is not being written and receives a read enabling signal. Consequently, data stored in that other bank of memory may be read during that clock period using the single address port of that bank of memory. Since writing to the banks of memory alternates between the two banks during succeeding clock periods, one of the banks is always available to be read. As with write operations, alternate memory banks are thus available for the read operations on alternate clock pulses.

The multiplexors 28 and 29, as mentioned above, alternate in transferring write addresses to the memory banks 22 and 23. Consequently, one of the multiplexors 28 and 29 is not transferring a write address during each clock cycle. The multiplexor 28 or 29 which is not transferring a write address is selected by the signal from the circuit 25 to transfer a read address to the one of the two memory banks 22 or 23 which is not being written during that clock cycle. More particularly, at the same time that the multiplexor 28 is transferring a write address to the address terminals of the bank 22, the zero value signal furnished by the selector circuit 25 enables the multiplexor 29 to transfer a read address to the address terminal of the memory bank 23. When, on the other hand, a one is furnished by the selector circuit 25, the multiplexor 28 is enabled to transfer a read address to the memory bank 22 while the multiplexor 29 transfers a write address to the memory bank 23. Thus, the multiplexors 28 and 29 transfer addresses furnished on sequential clocks by read addressing circuitry alternately to the address terminals of the memory banks 22 and 23.

Addresses to be read from the banks of memory 22 and 23 are furnished to the multiplexors 28 and 29 by a multiplexor 32. The multiplexor 32 receives the address from which the individual pieces of data are to be read from read address generating circuitry 31 which may also be circuitry similar to the address generating circuit 17 discussed above with respect to FIGS. 1a and 1b. A starting read address of zero is set in the register 18 of the circuitry 31 by a reset signal. The address in the register 18 may be incremented by the adder 15 in response to a POP signal from the destination for the data. The address at the output of the register 18 is furnished to the multiplexor 32 and to an incrementing circuit 38. The multiplexor 32 also receives the current read address incremented by a value of one from the incrementer circuit 38. Thus, on each clock cycle, the address at the output of the register 18 of the circuit 31 is transferred to the multiplexor 32 along with the current address incremented by a value of one so that either the address generated or that address incremented by one may be selected for transfer by the multiplexor 32 on each clock pulse during a read operation.

A read control signal MuxSel furnished to the multiplexor 32 allows the selection of the read address generated at the register 18 of the circuit 31 or the read address incremented by one from the adder 38. This allows the manipulation of the read address in a manner to be described hereinafter. This is often necessary in order to provide the correct sequence of addresses. For example, the circuitry using the data read from the memory banks 22 and 23 may not be ready to process the information because of some delay. In such a case, the address provided by the circuit 31 over sequential clock periods may be furnished without incrementing (in effect, a hold on incrementing the read address) by disabling the POP signal normally furnished to the adder 15 to increment the read address. This causes the same address to be furnished by the register 18 for as long as the POP signal is absent. The delay will necessitate that the data be read in a different order as will be discussed hereinafter. To accomplish this, the inverted value of the POP signal is transferred to a register 39. The register holds a single bit which is set to a zero to allow the transfer of the current address from the register 18 by the multiplexor 32. When the POP signal is a zero (a hold), the inverted (one) transferred to the enable terminal of the register 39 enables the inverted output of the register 39 to be transferred to its output, switching the multiplexor 32 so that the address from the incrementer 38 is instead transferred. The control signal furnished to the multiplexor 32 together with the POP signal (or its absence) allows one address or a sequence of addresses to be presented to the alternate banks of memory to access data. The use of this facility will be discussed below in particular examples.

As with the write addresses, the read addresses are transferred without a least significant bit; this least significant bit is, in effect, furnished by the bank of memory (zero or one) from which the data is read.

Although it is typical that the FIFO circuit 20 is written in bursts of sequential data, either sequences of data or individual pieces of data may be read from the FIFO circuit 20. Since the individual pieces of data in a sequence are stored in alternating memory banks, when a particular piece of information is to be read, the FIFO may be in a condition in which the particular bank of memory is being written. In such a case, it is necessary for the read operation to be delayed until the next clock period during which the address terminals of that bank of memory are available to receive a read address. One clock period is a relatively trivial delay when a sequence of data is being read; for once the read operation has delayed for one clock period until the data in the particular bank may be read, the next piece of data required and all of the remaining data in the sequence are in the correct banks of memory to be immediately read in that sequence. Consequently, the delay for reading sequences of data is relatively minor. However, if individual pieces of data are being read, or if two cycles are required to digest each piece of data read, then the memory banks will constantly be in the wrong operational state and a great deal of delay will be incurred.

For this reason, the present invention includes circuitry for controlling the reading of the two memory banks so that, at most, a single clock delay will occur in any operation in which a sequence of addresses are being read from the FIFO no matter how long each read operation takes to accomplish. As may be seen in FIG. 2, the DataOut terminals of each of the two banks of memory 22 and 23 furnish data to a multiplexor 34. The signal from the circuit 25 which controls whether a particular memory bank is in the write or the read condition is used to control the multiplexor 34 to select data to be read from the correct memory bank. Thus, the data selected by the multiplexor 34 is that currently being read from the bank of memory which is in the read condition. For example, when the circuit 25 provides a zero value signal to write to the bank 22 and to allow data to be read from the bank 23, the zero value causes the multiplexor 34 to select the data from the DataOut terminals of the memory bank 23.

The selected data is furnished both to a register 35 and directly to a second multiplexor 37. Thus, during a next succeeding clock period, there resides in the register 35 the data read from the selected memory address stored during the read operation in the previous clock period.

It will be recognized that if during any clock period the first piece of data of a sequence of data sought is in the memory bank presently being written, then the read operation must wait for one clock cycle to be able to read the data. Once the delay of one cycle has occurred, all of the data in a sequence may be read directly in that sequence from the memory banks through the multiplexor 34 and the multiplexor 37. Thus, where data is in the wrong memory bank, an initial delay of one clock period must occur before the data is available. On the other hand, if the first piece of data is in the memory bank being read during the initial clock period of the sequence, then that data is immediately available.

In order to signal to the circuitry which is reading the data that the data is in the wrong memory bank and a delay of one clock is occurring, a comparator circuit 40 compares a zero address with the address furnished by the register 18 of the circuit 31. If the addresses are the same a one output value is produced. This value is furnished to an AND gate 41. If the circuit 25 is providing a zero value indicating that bank 22 (bank zero) is being written, an inverter 42 provides a one to the AND gate 41, and a one output is generated to indicate a delay of one clock to the circuitry which is reading the data.

In order to operate the FIFO circuit 20 to read information in the correct order without excessive delay, the output MuxSel of the register 39 is utilized as a selection signal for the multiplexor 37. The selection signal MuxSel causes the multiplexor 37 to transfer data directly from the bank of memory being read after a one clock delay if the initial data in a sequence of data is in the memory bank being written during the first clock period of the read operation. In such a case, the address being read must be the current address. Then, after the delay, the selection signal is a CURRENT signal (a zero) indicating the value currently being read is to be transferred to the output through the multiplexor 37.

On the other hand, the MuxSel selection signal may be a DELAY signal (a one) so that the multiplexor 37 selects data from the register 35 instead of the current piece of data when the data is immediately available in the bank of memory being read. This DELAY signal allows the sequence of data to be read from the register 35 rather than from the current output of the multiplexor 34. However, when output data is to be read from the register 35, the address of the data to be placed in the register 35 must be available during the previous clock so that it is read from memory and is available in the register 35 for the output.

With this arrangement, so long as the next piece of data is taken on every succeeding clock cycle by the circuitry using the data, there will be no further delays in the reading of the two banks of memory since the data is always available either from the memory bank being read or in the register 35. Moreover, even if the circuitry requesting the read is unable to utilize the data on every clock cycle, any hold signal provided by that circuitry (discussed below) will institute the appropriate hold and thereafter cause the data to continue to be read in the proper sequence without any additional delay other than that due to the actual hold period. In a situation in which a large FIFO is required, the circuit of this invention is faster than the typical two port RAM conventionally used to implement a FIFO.

In order to accomplish the read out of the two memory banks so that the foregoing operations occur, the MuxSel selection signal provided at the output of the register 39 is initially set to zero by the reset signal. This CURRENT value causes the multiplexor 37 to transfer data to the output directly from the multiplexor 34 and thus directly from memory. When a hold occurs due to the absence of the POP signal, if the MuxSel selection signal is set to the value CURRENT (a zero) to cause the multiplexor to transfer the current data, it is switched to the value DELAY (a one) to cause the multiplexor 37 to transfer delayed data on the next clock cycle. However, the absence of the POP signal means that the value of the address at the output of the register 18 is not incremented. Instead, the next read address transferred by the multiplexor 32 is selected by the MuxSel selection signal to be the address from the incrementer 38. Since the incrementer 38 adds one to the output of the register 18, this increments the read address by one. This allows the data from the next sequential address to be placed in the register 35 where it will be available on the next clock.

On the other hand, when a hold occurs and the selection signal from the register 39 is set to cause the transfer of delayed data from the register 35, the MuxSel selection signal is switched to CURRENT (a zero) to cause the multiplexor 37 to transfer current data while the current read address is selected by the multiplexor 32 from the register 18. Since the POP signal is disabled to cause the hold, the address from the register 18 is the same as the last address provided by the register 18 and one less than that provided by the incrementer 38 on the last clock. It will be shown that in the arrangement of the present invention, the correct sequence of data is produced by this switching without adding any delay in the read accesses.

In order to demonstrate that the circuit of the present invention functions in the manner described, a number of different examples will be described using the charts of FIG. 3. In each of these examples, the output which it is desired to read from the FIFO is a sequence of data listed as pieces 0, 1, 2, 3, 4, 5, 6, 7, 8 to be produced, in general, one piece per clock cycle. These numbers used for these pieces of data may be considered to be addresses for this explanation so that a piece of data is stored in memory bank 22 if the address is even and in bank 23 if the address is odd. In each example, it will be considered that the circuit reading the FIFO 20 presents hold signals to the FIFO 20 at the points in the sequence of POP signals illustrated by a zero signifying that the POP signal is absent; in all cases in which a zero is not indicated, the POP signal is a one. A one in the row labelled Write Bank Sel indicates that bank 23 (bank 1) is being written during the particular clock period while a zero indicates that the bank 22 (bank 0) is being written. In a similar manner, a one in the row labelled ~Write Bank Sel indicates that bank 23 may be read during the particular clock period while a zero indicates that the bank 22 may be read during that clock period.

Thus, in the first example, the first piece of data (0) in the sequence desired is in the bank 22 of memory which is being written during that clock period. Thus, there must be a one clock period delay before the piece of data can be accessed. The fact of this delay is furnished to the destination circuitry by the AND gate 41. After that delay, the data is read directly from the bank 22 of memory by using the CURRENT value zero of MuxSel to select the value transferred by the multiplexor 37. As each following piece of data is read, it is also placed in the register 35 so that it is available on a one cycle delay should the MuxSel signal be set to DELAY (one) so that the value in the register 35 will be read.

At the eighth clock period, a hold signal (POP 0) is received indicating that the circuitry utilizing the information being read cannot use it at that clock. This causes the register 18 of the circuit 31 to hold its last read address on the next clock and the register 39 to switch states. During clock eight, the MuxSel signal generated by the register 39 remains at zero so that the multiplexor 37 furnishes the current data to the ReadData terminal; and this same data is furnished to the register 35. On the ninth clock, the MuxSel signal at the output of register 39 changes to a DELAY value (one) so that it indicates the hold; and the data (piece 6) is read again from the register 35. Thus, for two clock periods the data at memory address 6 is available at the output terminals accomplishing the desired one clock cycle hold.

During the ninth clock period, the address furnished as the current address is read from the incrementer 38 in response to the MuxSel value of one in accordance with the rule given above. Thus, the current address being read is address 7 from the incrementer 38. The data at this address is read and furnished to the register 35 so that it is available therein during clock period ten. Thus, on the next tenth clock, the value held by the register 35 has changed to that at memory address 7. This data is read in response to the MuxSel DELAY signal from the register 35. Thus, the readout provided has accomplished a one clock cycle hold as indicated by the first hold signal.

At the tenth clock cycle, the MuxSel signal is a delay or one value. This causes the current address to be read from the incrementer 38. The incrementer 38 provides the address at the output of the register 18 plus one. Since the register 18 holds an address delayed by one clock by the hold signal, the current address is address 7 plus one or eight.

At the tenth clock cycle, another hold is indicated by the absence of the POP signal, so that on the next clock the MuxSel signal changes from DELAY to CURRENT. At the same time (for clock 11), the current address to be read changes to the current value of the address being furnished to the output from the multiplexor 34. The current address being read is that at the output of the register 18 of the circuit 31. This address was delayed by one by the first hold signal so is presently at the address 7. Thus, on the eleventh clock cycle, the data at address 7 is read as the current data. Thus, a second hold of an additional clock cycle occurs. Thereafter, the output circuitry continues to furnish the current data in the proper sequence since no more holds occur.

In the second example, the first piece of data in the sequence desired is at address 0 which is in the bank 22 of memory presently being written. Thus, there must be a one clock period delay before the data can be accessed. This is signalled to the destination circuitry by the AND gate 41. After that delay, the information is read directly from the bank 22 of memory using the CURRENT value of MuxSel used to select the value transferred by the multiplexor 37. As each piece of data is read, it is also placed in the register 35 so that it is available on a one cycle delay if the MuxSel signal is set to read the register 35. At the eighth clock period, a hold signal is received indicating that the circuitry utilizing the information cannot use it during that clock. The MuxSel signal furnishes the current data from the register 18 to the output and to the register 35 during this clock period. On the next ninth clock, the MuxSel signal changes to DELAY to indicate the hold; and the data at the same address 6 is furnished again to the ReadData terminal from the register 35. Thereafter, the MuxSel signal remains in the delay condition and data is read sequentially from the register 35. Since the MuxSel signal remains a one, the address is read from the incrementer 38. The address is the value at the register 18 plus one. Since the register 18 is not incremented on the ninth clock but the incrementer 38 adds a one on that clock, the address from the circuit 31 continues in the normal sequence. However, since the data is read from the register 35 after the eighth clock, as is shown, the data is read in the correct sequence with a single clock period of delay initiated by the single hold signal.

In example three, the first piece of data at address 0 in the sequence desired is in the bank 22 of memory which may be currently read. Thus, no delay is signalled by the AND gate 41. The MuxSel signal is zero indicating that addresses are read from the register 18 and output is taken directly from the memory through the multiplexor 34. The data continues to be read directly from memory until clock seven when a hold signal is received from the destination circuitry. On the next clock the MuxSel signal switches to a one, the register 18 retains the address from clock seven, the address is taken from the incrementer 38, and the data is taken from the register 35. On clock nine, the register 18 increments its address from that received at clock seven, the address to be read is still taken from the incrementer 38, and the data is taken from the register 35. On clock nine, another hold signal is received. Therefore, on clock ten, the MuxSel signal changes from a one to a zero, the address is taken from register 18, register 18 holds an address delayed by two clocks (i.e., address 7), and data is once again furnished to the output directly from memory via the multiplexor 34 Thereafter, the MuxSel signal remains in the CURRENT condition and data is read directly from memory. Thus, as is shown, the data is read in the correct sequence with two clock periods of delay initiated by the two hold signals.

As will be seen, in the other examples illustrated the circuitry functions to provide the appropriate hold values and the appropriate sequence of signals in the manner indicated. In each case, only a single clock period is ever required to initially synchronize the signal; and no further delays other than those actually required to accomplish the hold periods occur.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit for accessing information, said circuit comprising:
   a clock supplying a clock signal having a first phase and a second phase;
   a first bank of single port random access memory that is accessed for reading during said first phase;
   a second bank of single port random access memory that is accessed for reading during said second phase;
   read circuitry, coupled to said first bank and to said second bank, sequentially reading every other piece of sequential data from an alternate one of said first bank of memory or said second bank of memory during said first and second clock phases, respectively;
   write circuitry writing data into said first bank of memory during said second phase and also writing data into said second bank of memory during said first phase, wherein at least one piece of data may be written to said first bank or to said second bank while an other bank is being read by said read circuitry; and
   recovery circuitry supplying data in response to removal of a hold condition, said recovery circuitry comprising:
   first address generation circuitry generating a first address in a given clock cycle for addressing said first bank or said second bank;
   second address generation circuitry generating a second address in said given clock cycle for addressing said first bank or said second bank wherein said second address is equal to an address succeeding said first address;
   delay storage circuitry delaying data output from said first bank and said second bank by one clock cycle; and
   multiplexing circuitry supplying information to output terminals from either said read circuitry or from said delay storage circuitry.

2. The circuit as described in claim 1 wherein said delay storage circuitry stores a maximum of one piece of data in response to a hold condition of N cycles in duration.

3. The circuit as described in claim 1 wherein, provided said hold condition is removed during said first phase of said clock signal, said multiplexing circuitry supplies said information from said delay storage circuit and wherein said first bank of memory and said second bank of memory are addressed by said second address and wherein further said data is delayed before being supplied to said output terminals.

4. The circuit as claimed in claim 3 wherein, provided said hold condition is removed during said second phase of said clock signal, said first bank of memory and said second bank of memory supply said data and wherein said first bank of memory and said second bank of memory are addressed by said first address.

5. A method of accessing information, said method comprising the steps of:
   (a) generating a clock signal having a first phase and a second phase;
   (b) sequentially reading every other piece of sequential data from an alternate one of a first bank of single port random access memory during said first phase or a second bank of single port random access memory during said second clock phase;
   (c) writing nonsequential data into said first bank of memory during said second phase and writing nonsequential data into said second bank of memory during said first phase, wherein at least one piece of nonsequential data may be written to said first bank or to said second bank while an other bank is being read by said step (b) of sequentially reading; and
   (d) supplying data to output terminals in response to removal of a hold condition, said step of supplying data comprising the steps of:
      (1) generating a first address in a given clock cycle for addressing said first bank or said second bank;
      (2) generating a second address in said given clock cycle for addressing said first bank or said second bank wherein said second address is equal to an address succeeding said first address;
      (3) delaying data output from said first bank and said second bank by one clock cycle by storing said data output from step (b) into a delay storage; and
      (4) outputting said data to said output terminals from either said step (b) of sequentially reading or from said delay storage.

6. The method as described in claim 5 wherein said delay storage contains a maximum of one data piece in response to a hold condition of N cycles in duration.

7. The method as described in claim 5 wherein, provided said hold condition is removed during said first phase of said clock signal, then said step (d)(4) of outputting said data to said output terminals outputs said data from said delay storage, and further comprising the step of addressing said first bank of memory and said second bank of memory by said second address and wherein said data is delayed before being output.

8. The method as described in claim 7 wherein, provided said hold condition is removed during said second phase of said clock signal, then said step (d)(4) of outputting said data to said output terminals outputs said data directly from said step (b) of sequentially reading, and further comprising the step of addressing said first bank of memory and said second bank of memory by said first address.

9. A circuit for accessing information, said circuit comprising:
   a clock supplying a clock signal having a first phase and a second phase;
   a first bank of single port random access memory accessed for reading during said first phase;
   a second bank of single port random access memory accessed for reading during said second phase;
   read circuitry coupled to said first bank and to said second bank sequentially reading every other piece of sequential data from an alternate one of said first bank of memory or said second bank of memory during said first and second clock phases, respectively;
   write circuitry writing data into said first bank of memory during said second phase and also writing data into said second bank of memory during said first phase; and
   recovery circuitry supplying data in response to removal of a hold condition, said recovery circuitry comprising:
   first address generation circuitry generating a first address within a given clock cycle for addressing said first bank or said second bank;
   second address generation circuitry generating a second address within said given clock cycle for addressing said first bank or said second bank wherein said second address is equal to an address succeeding said first address; and
   delay storage circuitry delaying data output from said first bank and said second bank.

10. The circuit as described in claim 9 wherein said delay storage circuit stores a maximum of one data piece in response to a hold condition of N cycles in duration and wherein said recovery circuitry supplies said data with a maximum of one cycle of delay subsequent to said removal of said hold condition of N cycles in duration.

11. The circuit as described in claim 9 wherein said delay storage circuit stores a maximum of one data piece in response to a hold condition of at least 2 cycles in duration.

12. The circuit as described in claim 9 wherein at least one piece of data may be written to said first bank or to said second bank by said write circuitry while an other bank is being read by said read circuitry.

13. The circuit as described in claim 12 wherein, provided said hold condition is removed during said first phase, said delay storage circuit supplies data to output terminals and wherein further said first bank of memory and said second bank of memory are addressed by said second address and wherein said data is delayed before being supplied.

14. The circuit as described in claim 13 wherein, provided said hold condition is removed during said second phase, said first bank of memory and said second bank of memory directly supply said data to said output terminals and wherein further said first bank of memory and said second bank of memory are addressed by said first address.

15. A circuit for providing a function of a dual port FIFO circuit comprising a first bank of single port random access memory, a second bank of single port random access memory, means for sequentially writing every other piece of sequential data to an alternate one of the first and second banks of memory during first and second clock phase signals, respectively, means for reading data first stored in the first and second bank of memory which is not being written during a period in which data is being written to the first and second bank of memory which is being written, and recovery means for supplying data in response to removal of a hold condition said recovery means comprising: means for generating a first address within a given clock cycle for addressing said first bank and said second bank, means for generating a second address within said given clock cycle for addressing said first bank and said second bank wherein said second address is equal to an addresses succeeding said first address, and delay storage means for delaying data output from said first bank and said second bank.

16. The circuit for providing the function of a dual port FIFO circuit as claimed in claim 15 further comprising means for furnishing to the output terminals data read from the first and second bank of memory or from the delay storage means.

17. The circuit for providing the function of a dual port FIFO circuit as claimed in claim 16 wherein, provided said hold condition is removed during said first clock phase signal, said means for furnishing supplies data to output terminals from said delay storage means and wherein further said first and second banks of memory are addressed by said second address.

18. The circuit for providing the function of a dual port FIFO circuit as claimed in claim 17 wherein, provided said hold condition is removed during said second phase, said means for furnishing supplies data to said output terminals directly from said first and second banks of memory and wherein further said first and second banks of memory are addressed by said first address.

19. The circuit for providing the function of a dual port FIFO circuit as claimed in claim 17 in which the means for furnishing to the output terminals data read from one of the first and the second banks of memory or from the delay storage means allows data to be furnished on a one clock cycle delay.

20. The circuit for providing the function of a dual port FIFO circuit as claimed in claim 19 in which the means for furnishing to the output terminals data read from the first and second bank of memory or from the delay storage means furnishes data from the other of either the first and second bank of memory or from the delay storage means whenever a destination for data cannot use the data during that clock period.

21. The circuit for providing the function of a dual port FIFO circuit as claimed in claim 17 in which the means for sequentially writing every other piece of sequential data to an alternate one of the first and second banks of memory comprises means for generating the first and second phase signals during succeeding clock periods, means for inverting the first and second phase signals, and means for using the signals generated and the inverted signals to enable either the first or the second bank of memory for writing during each clock period.

22. The circuit for providing the function of a dual port FIFO circuit as claimed in claim 21 in which the means for reading data first stored in the first and second bank of memory which is not being written during a period in which data is being written to the first and second bank of memory which is being written comprises means for utilizing the first and second phase signals to enable the first or the second bank of memory not being used for writing during each clock period.

23. The circuit for providing the function of a dual port FIFO circuit as claimed in claim 22 in which the means for sequentially writing every other piece of sequential data to an alternate one of the first and second banks of memory further comprises means for providing addresses for reading and writing data, and means for utilizing the first and second phase signals to select a write address for the first or the second bank of memory to which data is being written.

24. The circuit for providing the function of a dual port FIFO circuit as claimed in claim 21 in which the means for sequentially writing every other piece of sequential data to an alternate one of the first and second banks of memory further comprises means for providing addresses for reading and writing data, and means for utilizing the first and second phase signals to select a write address for the first or the second bank of memory to which data is being written.

25. The circuit for providing the function of a dual port FIFO circuit as claimed in claim 24 in which the means for reading data first stored in the first and second banks of memory which is not being written during a period in which data is being written to the first and second bank of memory which is being written further comprises means for utilizing the first and second phase signals to select a read address for the first or the second bank of memory from which data is being read.

26. The circuit for providing the function of a dual port FIFO circuit as claimed in claim 25 in which the means for reading data first stored in the first and second banks of memory which is not being written during a period in which data is being written to the first and second bank of memory which is being written further comprises means for gating output signals from the first and second banks of memory, and means for utilizing the first and second phase signals to select the first or the second bank of memory from which data is being read.

* * * * *